US006768673B1

United States Patent
Hsia et al.

(10) Patent No.: US 6,768,673 B1
(45) Date of Patent: Jul. 27, 2004

(54) METHOD OF PROGRAMMING AND READING A DUAL CELL MEMORY DEVICE

(75) Inventors: Edward Hsia, Saratoga, CA (US); Darlene Hamilton, San Jose, CA (US); Kulachet Tanpairoj, Palo Alto, CA (US); Mimi Lee, Santa Clara, CA (US); Alykhan F. Madhani, Santa Clara, CA (US); Yi He, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/422,276

(22) Filed: Apr. 24, 2003

(51) Int. Cl.[7] .............................................. G11C 16/04
(52) U.S. Cl. ............................. 365/185.03; 365/185.24
(58) Field of Search ....................... 365/185.03, 185.18, 365/185.22, 185.24

(56) References Cited

U.S. PATENT DOCUMENTS

| | | | |
|---|---|---|---|
| 6,009,017 A | * | 12/1999 | Guo et al. ............. 365/185.18 |
| 6,215,702 B1 | | 4/2001 | Derhacobian et al. |
| 6,246,611 B1 | | 6/2001 | Pawletko et al. |
| 6,295,228 B1 | | 9/2001 | Pawletko et al. |
| 6,307,784 B1 | | 10/2001 | Hamilton et al. |
| 6,309,926 B1 | | 10/2001 | Bell et al. |
| 6,331,951 B1 | | 12/2001 | Bautista, Jr. et al. |
| 6,344,994 B1 | | 2/2002 | Hamilton et al. |
| 6,356,482 B1 | | 3/2002 | Derhacobian et al. |
| 6,370,061 B1 | | 4/2002 | Yachareni et al. |
| 6,400,624 B1 | | 6/2002 | Parker et al. |
| 6,442,074 B1 | | 8/2002 | Hamilton et al. |
| 6,456,533 B1 | | 9/2002 | Hamilton et al. |
| 6,522,585 B2 | * | 2/2003 | Pasternak ............. 365/185.22 |

OTHER PUBLICATIONS

*Intel StrataFlash Memory Technology*, Intel Corporation, AP–677, Application Note, Dec. 1998, Order No. 297859–002.

* cited by examiner

*Primary Examiner*—Trong Phan
(74) *Attorney, Agent, or Firm*—Renner, Otto, Boisselle & Sklar, LLP

(57) ABSTRACT

A method of programming and reading a dual cell memory device. The method includes storing a selected program level in each cell and reading one of the cells to determine a single data value stored by the memory device.

26 Claims, 3 Drawing Sheets

US 6,768,673 B1

METHOD OF PROGRAMMING AND READING A DUAL CELL MEMORY DEVICE

TECHNICAL FIELD

The present invention relates generally to the field of non-volatile memory devices and, more particularly, to a method of storing data using a flash memory device, such as a dual cell electrically erasable and programmable memory device.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit (i.e., a binary data value have two states, such as a logical one and a logical zero) can be stored using a charge storing cell on a first "side" of the memory device and a second bit can be stored using a complimentary charge storing cell on a second "side" of the memory device.

Programming of such a memory device can be accomplished, for example, by hot electron injection. Hot electron injection involves "pulsing" the device by applying appropriate voltage potentials to each of a gate and a drain of the memory device for a specified duration. During the programming pulse, the source is typically grounded. Reading of the memory device can be accomplished by applying an appropriate voltage to each of the gate and the drain and comparing the drain to source current (as an indication of device threshold voltage) against a reference value to determine if the read charge trapping cell is in a programmed or an unprogrammed state.

Even though conventional charge trapping dielectric flash memory devices are capable of storing two single-bit binary data values per memory device, conventional charge trapping dielectric flash memory devices can suffer from data retention problems, especially over repeated program/erase cycles. Additionally, the "double-bit" data storage arrangement can result in read operation problems, such as complimentary bit disturb. Complimentary bit disturb most often arises when a programmed side a memory device effects the threshold voltage of the memory device during reading of an unprogrammed side of the memory device.

As a result, there is an ever increasing demand to store data in memory devices while increasing the data retention ability and reliability characteristics of the memory devices. There is also an ever increasing demand to lower the power consumed by the memory device.

SUMMARY OF THE INVENTION

According to one aspect of the invention, the invention is directed to a method of programming a dual cell memory device to store a single data value and of reading the data value. The memory device has a first charge storing cell and a second charge storing cell. The method includes storing a first amount of charge with the first charge storing cell, the first amount of charge corresponding to the data value and corresponding to a program state selected from a blank program level and a charged program level; storing a second amount of charge with the second charge storing cell, the second amount of charge corresponding to the data value and corresponding to the program state of the first charge storing cell; and reading one of the charge storing cells to determine the program state of each of the charge storing cells as an indication of the data value stored by the memory device.

According to another aspect of the invention, the invention is directed to a method of programming a dual cell memory device to store a single data value and of reading the data value. The memory device has a first charge storing cell and a second charge storing cell. The method includes storing a first amount of charge with the first charge storing cell, the first amount of charge corresponding to the data value and corresponding to a program state selected from a blank program level, a first charged program level, a second charged program level and a third charged program level, each program state being distinct from the other program states; storing a second amount of charge with the second charge storing cell, the second amount of charge corresponding to the data value and corresponding to the program state of the first charge storing cell; and reading one of the charge storing cells to determine the program state of each of the charge storing cells as an indication of the data value stored by the memory device.

BRIEF DESCRIPTION OF DRAWINGS

These and further features of the present invention will be apparent with reference to the following description and drawings, wherein.

DISCLOSURE OF INVENTION

Figure 1:
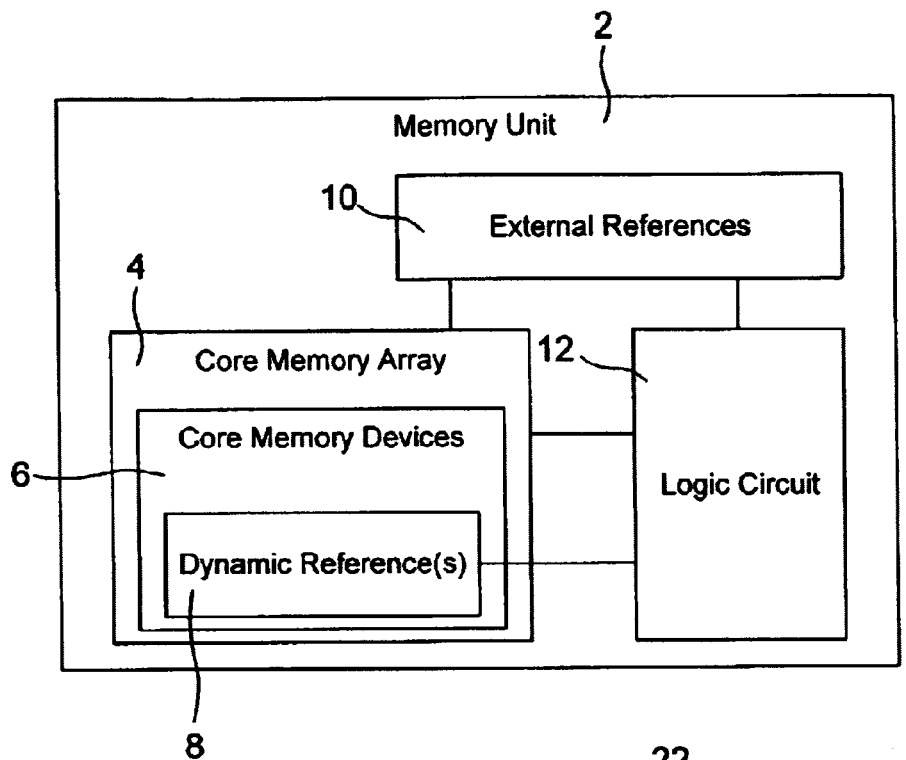
FIG. 1 is a schematic block diagram of an exemplary memory unit having a plurality of core memory devices to which a method of programming in accordance with the present invention can be applied.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, shown is a schematic block diagram of an exemplary memory unit 2. The memory unit 2 can include a core memory array 4 containing a plurality of memory devices, such as dual cell, non-volatile, flash electrically erasable and programmable memory devices. For example, the memory devices can be charge trapping dielectric flash memory devices as will be discussed in greater detail below.

The memory devices of the core memory array 4 can include a plurality of core memory devices 6 and associated dynamic reference memory devices 8. In one embodiment, the array 4 can be arranged such that the dynamic reference memory devices 8 are formed within a matrix of the core memory devices 6.

Other memory devices, such as external references 10, can also form a part of the memory unit 2. The external reference 10 are separate from the core memory array 4 and can include, for example, erase verify reference cells, program verify reference cells and soft programming reference cells.

As one skilled in the art will appreciate, the core memory devices 6 can be used by a customer of the memory unit 2 to store information, such as data or executable code. The dynamic references 8 can be used to assist in reading the core memory devices 6. More specifically, the dynamic references 8 are used as indicators of the data level behavior of the core memory devices 6. Various operations of the memory unit 2, including, for example, programming, verifying, reading and erasing, can be controlled by a logic circuit 12.

Figure 2:
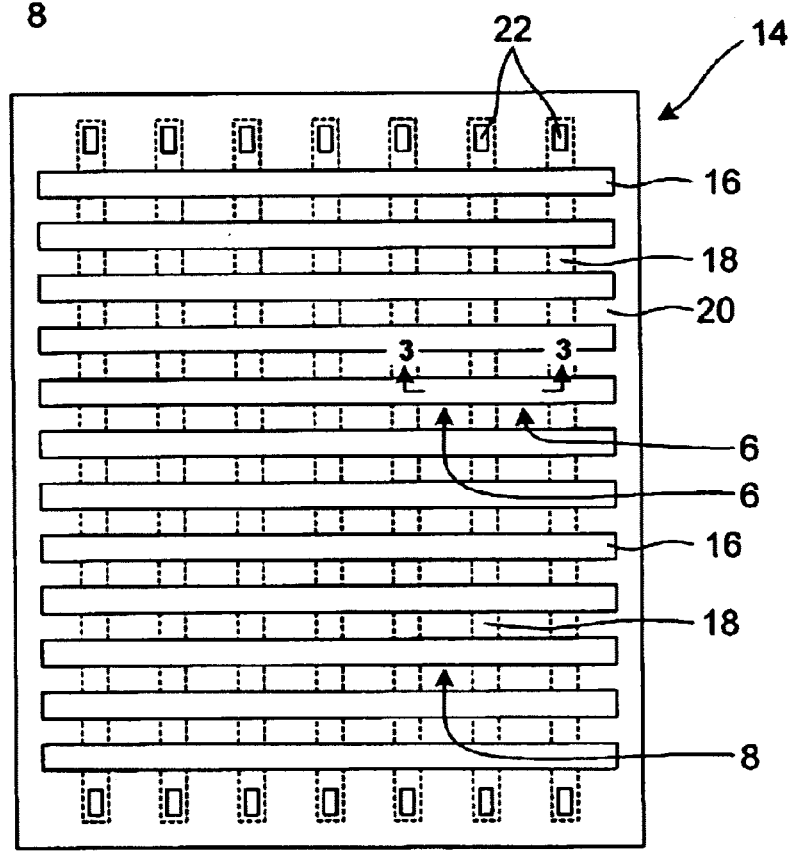
FIG. 2 is a schematic block diagram of a portion of a core memory array from the memory unit that can include the core memory devices.

With additional reference to FIG. 2, shown is a top view, schematic block diagram of a portion, or sector 14, of the core memory array 4 from the memory unit 2. The sector 14 can include core memory devices 6 and one or more dynamic reference devices 8. The sector 14 can include word lines 16 and bit lines 18 arranged with a dielectric stack 20 to operatively form the core memory devices 6 and the dynamic reference device(s) 8. Application of appropriate voltages to the word lines 16 and the bit lines 18 allows for the addressing of the memory devices 6, 8 of the sector 14 such that each memory device can be programmed, read, verified and/or erased. Bit line contacts 22 can be used to establish electrical connection to the bit lines 18 through the dielectric stack 20.

Figure 3:
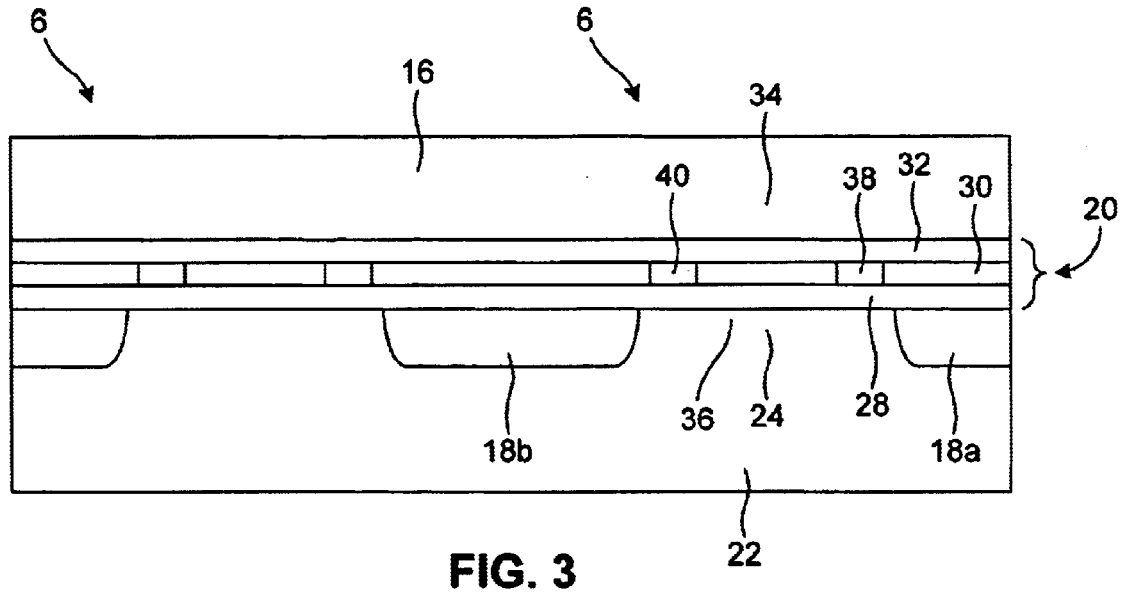
FIG. 3 is a schematic cross-section illustration of exemplary core memory devices from the core memory array taken along the line 3—3 of FIG. 2.

With additional reference to FIG. 3, a portion of the sector 14 is illustrated in cross-section to illustrate an exemplary arrangement of the memory devices of the core memory array 4. The cross-section of FIG. 3 shows two core memory devices 6. Each of the core memory devices 6, as well as the dynamic reference memory devices 8, can be implemented as a virtual ground, dual cell, non-volatile, flash electrically erasable and programmable memory devices. It should be understood that the illustrated memory devices 6 are shown for exemplary purposes and can be implemented with alternative structures (e.g., in stacked gate arrangement, in recessed gate arrangement, etc.). In addition, the relative positioning of the core memory devices 6 with respect to the dynamic reference 8 can be modified.

The exemplary memory devices 6 are implemented as a charge trapping dielectric type flash memory devices, each of which includes a pair of complimentary charge trapping regions that can be independently programmed and read.

For simplicity of the discussion herein, only the arrangement of one core memory device 6 will be described. However, the remaining core memory devices 6 and the dynamic reference memory devices 8 can have a corresponding structure and operation.

In the illustrated embodiment, the core memory device 6 includes a P-type semiconductor substrate 22. Within the substrate 22, the bit lines 18 are formed in a buried bit line format. The bit lines 18 (also referred to herein as conductive regions) can be formed by implanting N-type dopant into the substrate 22, or from a metal or metal containing compound (e.g., silicide bit lines 18). For each device 6, adjacent pair of bit lines 18 form conductive regions that function as a source and a drain during various programming and reading operations. For each device, a body 24 is disposed between the adjacent pairs of bit lines 18. Although not illustrated, a nitride layer can be formed over the bit lines 18 and P+ pocket implants can be added adjacent the bit lines 18.

Above the substrate 22 is the dielectric stack 20. The dielectric stack 20 includes a bottom dielectric layer 28 (also referred to as a tunneling dielectric layer) that is made from, for example, silicon oxide ($SiO_2$), other standard-K material (e.g., have a relative permittivity below ten) or a high-K material (e.g., have a relative permittivity, in one embodiment, above ten and, in one embodiment, above twenty).

Over the bottom dielectric layer 28 is a charge trapping layer (also referred to as a charge storing layer 30). The charge storing layer 30 can be made from, for example, a non-conductive material including silicon nitride ($Si_3N_4$) or other suitable material.

Over the charge storing layer 30 is another dielectric layer (also referred to as a top dielectric layer 32) made from a material such as, for example, silicon oxide, other standard-K material or a high-K material.

The word lines 16 are formed over the top dielectric layer 32. For each core memory device 6, one of the word lines 16 functions as a gate electrode 34. The word lines 16 can be formed from, for example, polycrystalline silicon. In alternative arrangements, the gate electrodes 34 can be formed from interconnected conductive islands or pads. A work function of the word line 16 and the dielectric stack 20 controls a channel 36 within the body 24, extending from one bit line 18 to an adjacent bit line 18.

As one skilled in the art will appreciate, modifications to the core memory devices 6 can be made. Such modifications can include changes to the physical arrangement of the core memory device 6, materials used, doping parameters and the like. However, the programming, verifying, reading and/or erasing techniques described herein can be used in conjunction with such a modified device.

The core memory devices 6 can be configured as a virtual ground devices. That is, during various operations of the memory devices 6 either of the bit lines 18 associated with the memory device 6 can function as a source of electrons or holes by respectively controlling the voltage potentials applied to the corresponding bit lines 18. In addition, the bit line 18, functioning as the source of electrons and/or holes can be grounded or can be connected to a bias potential.

As will become more apparent from the discussion below, within the charge storing layer 30, the core memory device 6 includes a first charge storing region (also referred to herein as a normal cell, a right-hand bit or a first charge storing cell 38) adjacent one of the conductive regions (e.g., the bit line identified as bit line 18a) and a second charge storing region (also referred to herein as a complimentary cell, a left-hand bit or a second charge storing cell 40) adjacent the other of the conductive regions (e.g., the bit line identified as bit line 18b).

In one embodiment, referred to herein as a "single-bit" embodiment, each charge storing cell 38, 40 can have two data states. However, each charge storing cell 38, 40 is programmed to stored the same data state. To determine the data state stored by each charge storing cell 38, 40, one of the charge storing cells 38, 40 can be read as discussed in greater detail below. The data states can represent binary values such as a logical zero and a logical one. The logical one, for example, can be implemented by leaving each charge storing cell 38, 40 in an unprogrammed state, also referred to as a blank program level. The logical zero, for example, can be implemented by storing respective amounts of charge in each charge storing cell 38, 40. This condition is also referred to as a charged state, a programmed state, a programmed level or a charged program level.

In another embodiment, referred to herein as a "single-bit multi-level cell (MLC)" embodiment or "single-bit MLC" embodiment, each charge storing cell 38, 40 can have multiple data states, such as four data states. However, each charge storing cell 38, 40 is programmed to stored the same data state. To determine the data state stored by each charge storing cell 38, 40, one of the charge storing cells 38, 40 can be read as discussed in greater detail below. The data states in the single-bit MLC can represent a two bit binary word, such as a logical zero-zero, logical zero-one, logical one-zero and logical one-one. The logical one-one data state, for example, can be implemented by leaving each charge storing cell 38, 40 in an unprogrammed state, also referred to as a blank program level which will be referred to herein as "level A". The other logical data states, for example, can be implemented by storing distinguishable amounts of charge in each charge storing cell 38, 40, which are also referred to as a charged states, programmed states, programmed levels or charged program levels. A lowest charged program level corresponding to the one-zero data state will be referred to herein as "level B". A medium charged program level corresponding to the zero-one data state will be referred to herein as "level B". A highest charged program level corresponding to the zero-zero data state will be referred to herein as "level D". In another implementation of the single-bit MLC embodiment, there can be more than three charged program levels.

In the illustrated embodiment, the core memory device 6 is a structurally symmetrical device allowing for programming, verifying, reading and erasing of the first charge storing cell 38 and the second charge storing cell 40 by respectively switching the roles of the bit lines 18a and 18b (source and drain) during those operations. Therefore, the bit lines 18a, 18b will be referred to interchangeably by the terms source and drain, depending on the charge storing cell 38, 40 of interest.

For purposes of the present disclosure, the programming technique to store charge with either of the charge storing cells 38, 40 involves hot electron injection, also referred to as channel hot electron injection (CHE). However, it should be appreciated that modifications to the programming techniques can be made to accommodate variations in the specific memory device used.

Using hot electron injection, the first charge storing cell 38 can be programmed to the desired charged program level (in the single-bit embodiment, the single charged program level or in the single bit MLC embodiment, any of the multiple charged program levels) by applying a selected voltage to the bit line 18a (functioning as the drain) adjacent the first charge storing cell 38. In addition, a selected voltage is applied to the word line 16 (functioning as the gate electrode 34). The other bit line 18b functions as the source (i.e., source of electrons) for the CHE programming of the first charge storing cell 38. In one embodiment, a bias voltage potential is applied to the source (rather than grounding or floating the source as found in conventional charge trapping dielectric flash memory devices). As a result of the application of a bias potential to the source during programming, greater control over electron injection can be accomplished, which can lead to enhanced data retention capability of the memory device 6 and/or greater charge injection accuracy for achieving the desired charged program level.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 38 adjacent the drain (i.e., bit line 18a), where the electrons have gained the most energy. These accelerated electrons are termed hot electrons and once injected into the charge storing layer 30, stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 38 close to the adjacent bit line 18a.

The foregoing technique to program the first charge storing cell 38 can be used to program the second charge storing cell 40, but the functions of the bit lines 18a and 18b (i.e., source and drain) are reversed.

Figure 4:
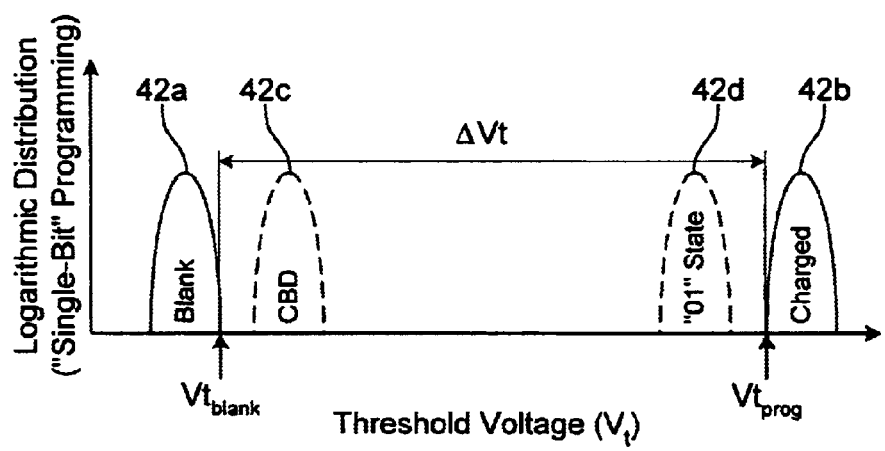
FIG. 4 is a population plot that includes relative program level threshold voltage distributions for "single-bit" programming of a charge storing cell from the core memory device.

With additional reference to FIG. 4, shown is a population plot that includes relative program level threshold voltage (Vt) distributions 42 for single-bit programming of a charge storing cell 38, 40 from the core memory device 6. The threshold voltage distributions 42 are indicative of the data state behavior of the core memory device 6 when the charge storing cells 38, 40 are placed in various respective data states. It is noted that although the core memory device 6 is capable of asymmetrical data retention, the data state of each of the charge storing cells 38, 40 is programmed to be the same.

A first distribution 42a represents a logarithmic threshold voltage distribution for the dynamic reference 8 when both charge storing cells 38, 40 store respective charge amounts corresponding to the blank program level. That is, when one of the charge storage cells 38, 40 is read and both charge storing cells 38, 40 are in the blank state, the threshold voltage of the dynamic reference should fall within the first distribution 42a. Using the corresponding binary data values for this data storage condition, the first distribution 42a can be referred to as a "11" state, where the first "1" of the "11" corresponds to charge storing cell 38, 40 being read (or "read bit") and the second "1" of the "11" corresponds to the other of the charge storing cells 38, 40 (or "unread bit"). A maximum value of the first distribution 42a represents an erase or blank threshold voltage ($Vt_{blank}$) of the dynamic reference 8.

A second distribution 42b represents a logarithmic threshold voltage distribution for the core memory device 6 when both charge storing cells 38, 40 store respective charge amounts corresponding to the charged program level. That is, when one of the charge storage cells 38, 40 is read and both charge storing cells 38, 40 are in the charged state, the threshold voltage of the dynamic reference should fall within the second distribution 42b. Using the corresponding binary data value for this data storage condition, the second distribution 42b can be referred to as a "00" state, where the first "0" of the "00" corresponds to the read bit and the second "0" of the "00" corresponds to the unread bit.

Although each charge storing cell 38, 40 is programmed to the same data state, FIG. 4 also illustrates a condition known as complimentary bit disturb. More specifically, a third distribution 42c represents a logarithmic threshold voltage distribution for the core memory device 6 when the read one of the charge storing cells 38, 40 stores a charge amount corresponding to the blank program level and the unread one of the charge storing cells 38, 40 stores a charge amount corresponding to the charged program level. Using the corresponding binary data value for this data storage condition and the first and second digit naming convention identified above, the third distribution 42c can be referred to as a "10" state. The "10" state can also be referred to as a complimentary bit disturb (CBD) state since the charge stored by the unread bit has the effect of slightly increasing the threshold voltage of the memory device 6 above the blank state distribution 42a.

A fourth distribution 42d represents a logarithmic threshold voltage distribution for the core memory device if the read one of the charge storing cells 38, 40 stores a charge amount corresponding to the charged program level and the unread one of the charge storing cells 38, 40 stores a charge amount corresponding to the blank program level. Using the corresponding binary data value for this data storage condition and the first and second digit naming convention identified above, the third distribution 42b can be referred to as a "01" state. In this situation, the differing charge amounts stored by the charge storing cells 38, 40 has the effect of slightly decreasing the threshold voltage of the memory device 6 below the programmed state distribution 42b.

Reading of the cells 38, 40 of the core memory device 6 can be carried out using, for example, a reverse read operation. For example, to read the first charge storing cell 38, a voltage can be applied to the conductive region opposite the first charge storing region 38 (i.e., bit line 18b, which is also referred to as the drain during read operations) and a voltage can be applied to the gate electrode 34. The conductive region adjacent the first charge storing region 38 (i.e., bit line 18a, which is also referred to as the source during read operations) can be grounded. To read the second charge storing cell 40, the roles of the bit lines 18a and 18b can be reversed.

During the read operation, an amount of current drawn across the channel 36 can be used as an indication of core memory device 6 threshold voltage and can be compared against a reference current(s) (the reference current acting as an indication of a reference threshold voltage) to determine the data state of the "read" one of the charge storing cells 38, 40. In one embodiment, a read margin (or $\Delta Vt$) can be a difference between a minimum program threshold voltage of the programmed state threshold distribution ($Vt_{prog}$) and $Vt_{blank}$.

In conventional dielectric charge trapping memory devices, the read operation drain voltage functions to create a depletion region in the channel 36 under the unread charge storing cell 38, 40. This depletion region can partially mask, or "cover up," any charge stored by the unread charge storing cell 38, 40 to minimize the effect of CBD on read margin. That is, when reading a "10" without a relatively high read operation drain voltage, read margin can be reduced to the difference between a minimum threshold voltage of the "01" state threshold voltage distribution 42d and a maximum threshold voltage of the "10" state threshold voltage distribution 42c. In conventional read operations, the drain voltage is about 1.3 V to about 1.6 V and the gate voltage is about five volts. For a low voltage operation memory unit 2, where Vcc is about 1.8 V, the read operation drain voltage in the 1.3 V to 1.6 V range can be difficult to maintain. In addition, a large amount of power is consumed by the memory device when reading hundreds or thousands of core memory devices 6 during the read operation. As will be described in greater detail below, the programming and reading techniques described herein can be used to lower read operation drain voltage.

Figure 5:
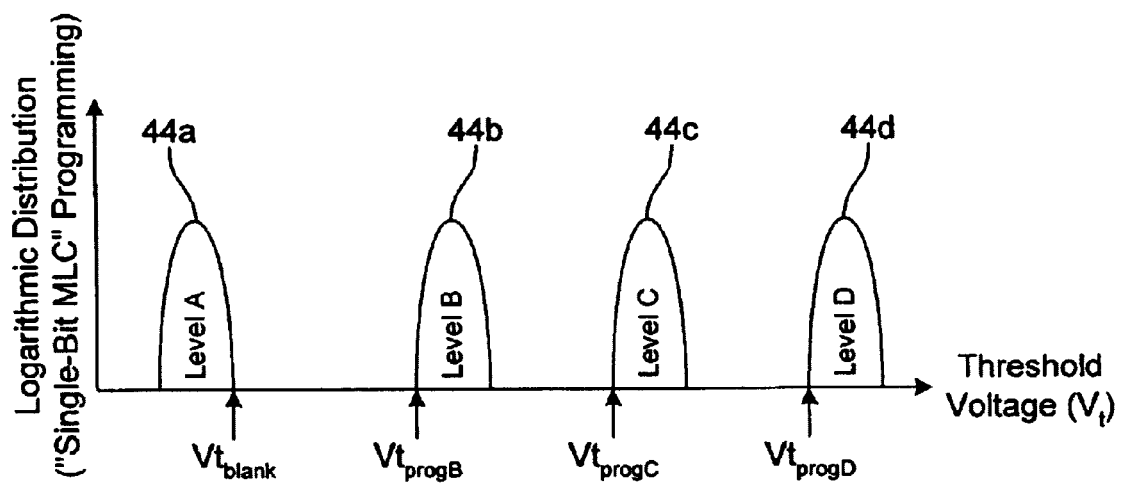
FIG. 5 is a population plot that includes relative program level threshold voltage distributions for "single-bit multi-level cell (MLC)" programming of a charge storing cell from the core memory device.

With additional reference to FIG. 5, shown is a population plot that includes relative threshold voltage (Vt) distributions 44 that are indicative of the data states for one of the charge storing cells 38, 40 of the core memory device 6 when programmed using the single-bit MLC embodiment. The blank state, or level A, is represented by distribution 44a, level B is represented by distribution 44b, level C is represented by distribution 44c and level D is represented by distribution 44d. Relative threshold voltage distributions for the data states of the other of the charge storing cells 38, 40 of the core memory device 6 would have similar appearance to those illustrated in FIG. 5.

As indicated above, each charge storing cell is programmed to the same data state. However, if the charge storing cells 38, 40 were programmed to dissimilar data states, the threshold voltage distributions 44 can have a tendency to shift upward or downward along the threshold voltage axis as a result of CBD. For simplicity of the drawing figures attached hereto, CBD threshold voltage distributions similar to the CBD threshold distributions 42c and 42d (FIG. 4) illustrated for the single bit embodiment are not illustrated in FIG. 5.

MLC programming in the virtual ground arrangement can be accomplished by associating each charged program level with specified program voltages, including a gate voltage ($V_g$), a source voltage ($V_s$) and/or a drain voltage ($V_d$). The varying $V_g$, $V_s$ and $V_d$ for each program level allows control over the amount of charge stored in the respective charge storing cells 38, 40. As a result of injecting desired amounts of charge, the threshold voltage (Vt) of the core memory device 6 during verify operations can fall above a program-verify reference value corresponding to the target charged program level and/or during read operations, the Vt of the core memory device 6 can fall with the predetermined threshold voltage distributions 44. Alternatively, the programming duration can be controlled to regulate the amount of the charge stored in the respective charge storing cell 38, 40. In yet another embodiment, the program voltages and the programming duration can be altered in conjunction with one another to achieve the desired charge amount in the target charge storing cell 38, 40.

In the virtual ground arrangement of the core memory device 6, a voltage bias (e.g., a voltage potential other than ground) can be applied to the source during programming. The source bias voltage, in combination with the voltage potentials applied to the gate electrode 34 and the drain, can be used to result in additional control over the programming of the core memory device 6.

Additional discussion of MLC programming, including progressively adjusted pulse parameters, can be found in co-owned U.S. patent application Ser. No. 10/422,090 filed Apr. 24, 2003 (titled "METHOD OF CONTROLLING PROGRAM THRESHOLD VOLTAGE DISTRIBUTION OF DUAL CELL MEMORY DEVICE) and in co-owned U.S. patent application Ser. No. 10/413,800 filed Apr. 15, 2003 (titled "METHOD OF PROGRAMMING DUAL CELL MEMORY DEVICE TO STORE MULTIPLE DATA STATES PER CELL"), the disclosures of which are incorporated by reference herein in their entireties.

With continuing reference to FIG. 5, the combination of program conditions are selected such that when the target charge storing cell 38, 40 is programmed to level D, the amount of charged stored by the cell 38, 40 is higher than the amount of charge stored by the cell 38, 40 when the cell 38, 40 is programmed to level C. In one embodiment, a minimum threshold voltage ($Vt_{progD}$) of the level D distribution 44d is about one volt higher than a maximum threshold voltage of the level C distribution 44c. Similarly, the amount of charged stored by the cell 38, 40 programmed to level C is higher than the amount of charge stored by the cell 38, 40 when the cell 38, 40 is programmed to level B. In one embodiment, a minimum threshold voltage ($Vt_{progC}$) of the level C distribution 44c is about one volt higher than a maximum threshold voltage of the level B distribution 44b. Similarly, the amount of charged stored by the cell 38, 40 programmed to level B is higher than the amount of charge stored by the cell 38, 40 when the cell 38, 40 is programmed to level A. In one embodiment, a minimum threshold voltage ($Vt_{progB}$) of the level B distribution 44b is about 1.5 volts higher than a maximum threshold voltage of the level A distribution 44a, or the erase threshold voltage ($Vt_{blank}$).

After the core memory device 6 has been pulsed to inject charge into one of the charge storing cells 38, 40, a verify operation can be conducted to verify that the core memory device 6 was programmed to the desired charged program level B–D. The verify operation can include comparing a drain to source current ($I_{ds}$) of the core memory device 6 (or $I_{core}$) that is generated when appropriate voltages are applied to the gate electrode 34, the source and/or the drain against a current generated by an external verify reference device corresponding to the desired charged program level B–D. Accordingly, the external references 10 (FIG. 1) can include at least three fixed (e.g., statically charged) program verify references, each capable of providing a reference current corresponding to the charged program levels B–D (e.g., $I_{vref}$/B for verifying charge storage corresponding to level B, $I_{vref}$/C for verifying charge storage corresponding to level C, and $I_{vref}$/D for verifying charge storage corresponding to level D. Noting that memory device 6 threshold voltage and $I_{core}$ have an inverse relationship (that is, as the charged program state increases, threshold voltage also increases but $I_{core}$ decreases), if $I_{core}$ is less than the $I_{vref}$ corresponding to the desired program level, then the logic circuit 12 can conclude that the target charge storing cell 38, 40 is appropriately charged and programming of a subsequent charge storing cell 38, 40 to be programmed can be commenced. If, however, the $I_{core}$ is greater than the $I_{ref}$ corresponding to the desired program level, then the logic circuit 12 can conclude that the target charge storing cell 38, 40 is not charged to the desired program level and the target charge storing cell 38, 40 can be repulsed.

Although not discussed above, a similar program verify operation can be used for the single-bit embodiment. It is noted that the threshold voltage distribution 42a for the blank state of the single-bit embodiment can correspond to the threshold voltage distribution 44a for the blank state of the single-bit MLC embodiment (e.g., the minimum, maximum and peak distribution points can be the same or approximately the same). Similarly, the threshold voltage distribution 42b for the charged program state of the single-bit embodiment can correspond to the threshold voltage distribution 44d for the highest charge program state of the single-bit MLC embodiment (e.g., the minimum, maximum and peak distribution points can be the same or approximately the same).

Figure 6:
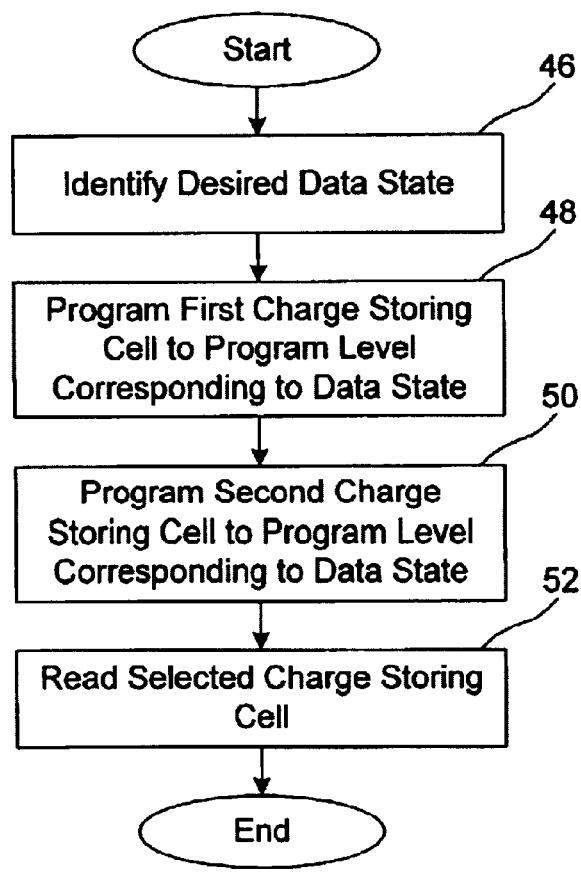
FIG. 6 is a flow diagram of a program operation followed by a read operation for the dual cell memory device.

With additional reference to FIG. 6, a flow diagram of a program operation followed by a read operation for the core memory device 6 is illustrated. It is noted that the method applies to both the single-bit and single-bit MLC embodiments of the present invention. The method can start in block 46 where the desired data state for the core memory device 6 as a whole is identified. In the single bit embodiment, the desired data state corresponds to either the blank program level or the charged program level. For the MLC embodiment, the desired data state corresponds to the blank program level or one of the multiple charged program levels.

Next, in block 48, the first charge storing cell 38 can be programmed to store an amount of charge corresponding to the desired data state, or program level. If the desired data state corresponds to the blank program, no charge injection is needed and the method can continue as described herein. If the desired data state corresponds to a charged program level, electrons can be injected into the charge storing cell 38 by applying voltages to the gate electrode 34, the drain (bit line 18a) and, optionally, the source (bit line 18b).

Thereafter, in block 50, the second charge storing cell 40 can be programmed. If the desired data state corresponds to the blank program, no charge injection is needed and the method can continue as described herein. If the desired data state corresponds to a charged program level, electrons can be injected into the charge storing cell 40 by applying voltages to the gate electrode 34, the drain (bit line 18b) and, optionally, the source (bit line 18a).

As indicated, both charge storing cells 38, 40 are charged to the same program level. In the single-bit embodiment, both charge storing cells 38, 40 are either left in the blank state or programmed to store an amount of charge corresponding to the charged programmed level. In the single-bit MLC embodiment, both charge storing cells 38, 40 are either left in the blank state or programmed to store an amount of charge corresponding to one of the charge programmed levels (in the illustrated embodiment, the charged program levels include level B, level C and level D).

As one skilled in the art will appreciate, either of the first charge storing cell 38 or the second charge storing cell 40 can be programmed first. Therefore, blocks 48 and 50 can be reversed. However, in one embodiment and as discussed in greater detail below, the charge storing cell 38, 40 programmed last is the charge storing cell 38, 40 selected for interrogation during a read operation. Alternatively, the charge storing cell 38, 40 programmed first is the charge storing cell 38, 40 selected for interrogation during a read operation.

As should also be appreciated, the illustrated method is directed to programming and reading one memory device 6. One skilled in the art will recognized that the method can be applied to programming and/or reading all or some of the core memory devices 6 of the core memory array 4. For instance, selected core memory devices 6 can be programmed by repeating the operations of blocks 46 through 50 before a read operation is carried out.

The method illustrated in FIG. 6 can optionally continue in block 52 where the memory device 6 is read. As indicated, in one embodiment of the invention, the second programmed charge storing cell 38, 40 is interrogated during the read operation. In effect, the read operation "ignores" the data state of the first programmed charge storing cell 38, 40 and focuses on the second programmed charge storing cell 38, 40.

Reading the second programmed of the charge storing cells 38, 40, at least in some instances, can improve the reliability of memory unit 2 in terms of data retention and read operation accuracy. The improved reliability stems from the effect that a charge stored by the first programmed charge storing cell 38, 40 has on the second programmed charge storage cells 38, 40. More specifically, following charge injection into the first programmed charge storing cell 38, 40, a charge distribution may remain in the channel 36. This charge distribution, as well as the charge stored by the first programmed charge storing cell 38, 40, may modify the program operation of the second programmed charge storing cell 38, 40. These factors may increase the amount of charge per unit time that can be programmed into the second programmed charge storing cell 38, 40. Advantageously, such alteration to the program conditions for the second programmed of the charge storing cell 38, 40 can result in the second of the charge storing cell 38, 40 holding a greater amount of charge and/or holding that charge more reliably than the first programmed charge storing cell 38, 40. As a result, reading the second programmed charge storing cell 38, 40 can result in more accurate and reliable operation of the memory unit 2.

In an alternative embodiment, the first programmed charge storing cell 38, 40 is read. In this embodiment, it may be desirable to avoid "over-programming" the second programmed charge storing cell 38, 40. That is, the amount of charge and the lateral placement of the charge should closely resemble the charge characteristics stored by the first programmed charge storing cell 38, 40. Additional discussion regarding controlling charge injection for this purpose can be found in co-owned U.S. patent application Ser. No. 10/422,090 filed Apr. 24, 2003 (titled "METHOD OF CONTROLLING PROGRAM THRESHOLD VOLTAGE DISTRIBUTION OF DUAL CELL MEMORY DEVICE) and in co-owned U.S. patent application Ser. No. 10/422,489 filed Apr. 24, 2003 (titled "METHOD OF PROGRAMMING A DUAL CELL MEMORY DEVICE"), the disclosures of which are incorporated by reference herein in their entireties.

Therefore, in accordance with one aspect of the invention, two program operations are carried out to separately program each charge storing cell 38, 40 the memory device 6 with the same data state, thereby storing a single data value using the core memory device 6. Thereafter, the single data value can be ascertained with one read operation.

As indicated, the read charge storing cell 38, 40 to be read can be read using a "reverse read" operation where read voltages are applied to the gate electrode 34 and the conductive region (i.e., drain) adjacent the unread charge storing cell 38, 40. In one embodiment, about two volts to about three volts can be applied to the gate electrode 34. In addition, the read operation drain voltage can be less than one volt (e.g., about 0.4 volts to about 0.7 volts) since CBD issues are not introduced when programming and reading the memory device 6 using the techniques described herein. In one embodiment, about three volts can be applied to the gate electrode 34 and about 0.6 volts can be applied to the drain. During interrogation, the source (or conductive region adjacent the read charge storing cell 38, 40) can be grounded. The current drawn across the channel 36 during the read operation is indicative of the threshold voltage of the memory device 6 and can be compared to a reference current (single-bit embodiment) or currents (single-bit MLC embodiment) to determine the data state stored by the memory device 6.

Easing of the memory device 6 can be carried out using conventional techniques for erasing a charge trapping dielectric memory device. For example, a band-to-band (BTB) hot hole injection technique can be used to remove charge from the charge storing cells 38, 40.

As should be apparent, the programming technique of the present invention can be used to increase the density of data bits stored per unit area of an integrated circuit memory core. For example, a single memory device 6 programmed in accordance with the single-bit MLC embodiment can replace two or more conventional floating gate memory devices.

Furthermore, the memory device 6 when programmed using either of the single bit embodiment or the single-bit MLC embodiment can have improved performance with less power consumption over a conventionally programmed charge trapping dielectric memory devices that uses an asymmetrical "double-bit" data storage format. In addition, when the MLC embodiment is used to program the memory device 6, there is no reduction in the amount of data stored by the memory device 6 as compared to a conventionally programmed charge trapping dielectric memory device that uses a "double-bit" data storage format.

Furthermore, the relatively low voltage read operation drain voltage applied to the memory device 6 during read operations tends to increase the speed with which the memory core 4 can be read. In addition, the power consumption, size and manufacturing costs of the memory core 4 can be reduced.

Furthermore, data retention over program/erase (P/E) cycling can be improved. It has been found that when each charge storing cells 38, 40 is used to store charge, the memory cell 6 as a whole can store charge better than when one charge storing cell 38, 40 is blank and the other is used to store charge.

Although particular embodiments of the invention have been described in detail, it is understood that the invention is not limited correspondingly in scope, but includes all changes, modifications and equivalents coming within the spirit and terms of the claims appended hereto.

For example, each of the charge storing cells 38, 40 can be programmed with greater resolution (e.g., additional program levels) such that each memory device 6 can store three or more bits of data.

What is claimed is:

1. A method of programming a dual cell memory device to store a single data value and of reading the data value, the memory device having a first charge storing cell and a second charge storing cell, comprising:
   storing a first amount of charge with the first charge storing cell, the first amount of charge corresponding to the data value and corresponding to a program state selected from a blank program level and a charged program level;
   storing a second amount of charge with the second charge storing cell, the second amount of charge corresponding to the data value and corresponding to the program state of the first charge storing cell; and
   reading one of the charge storing cells to determine the program state of each of the charge storing cells as an indication of the data value stored by the memory device.

2. The method according to claim 1, wherein the program state for the first charge storing cell and the second charge storing cell corresponds to the charged program level, and storing the first amount of charge includes programming the first charge storing cell by injecting electrons into the first charge storing cell and storing the second amount of charge includes programming the second charge storing cell by injecting electrons into the second charge storing cell.

3. The method according to claim 2, wherein the read one of the charge storing cells is the second programmed charge storing cell.

4. The method according to claim 1, wherein the read one of the charge storing cells is the second programmed charge storing cell.

5. The method according to claim 1, wherein the charge storing cells are regions of a charge storing layer that is operatively arranged with a first conductive region adjacent the first charge storing cell, a second conductive region adjacent the second charge storing cell and a gate electrode and storing the charge program level for each charge storing cell respectively includes applying a source bias voltage potential to the conductive region adjacent the programmed charge storing cell.

6. The method according to claim 1, wherein the charge storing cells are regions of a charge storing layer that is operatively arranged with a first conductive region adjacent the first charge storing cell, a second conductive region adjacent the second charge storing cell and a gate electrode and during reading, a voltage potential is applied to the conductive region adjacent the unread one of the charge storing cells, the voltage potential being less than one volt.

7. The method according to claim 6, wherein the voltage potential applied to the conductive region adjacent the unread one of the charge storing cells is about 0.4 volts to about 0.7 volts.

8. The method according to claim 6, wherein the read one of the charge storing cells is the second of the charge storing cells to be programmed.

9. The method according to claim 6, wherein the read one of the charge storing cells is the first of the charge storing cells to be programmed.

10. The method according to claim 6, wherein during reading, a voltage potential is applied to the gate electrode and the conductive region adjacent the read charge storing cell is grounded.

11. The method according to claim 1, wherein reading the charge storing cell includes comparing a threshold voltage of the memory device against a value to determine the program state of the read one of the charge storing cells.

12. The method according to claim 1, further comprising outputting a digital value associated with the data value stored by the memory device.

13. A method of programming a dual cell memory device to store a single data value and of reading the data value, the memory device having a first charge storing cell and a second charge storing cell, comprising:

storing a first amount of charge with the first charge storing cell, the first amount of charge corresponding to the data value and corresponding to a program state selected from a blank program level, a first charged program level, a second charged program level and a third charged program level, each program state being distinct from the other program states;

storing a second amount of charge with the second charge storing cell, the second amount of charge corresponding to the data value and corresponding to the program state of the first charge storing cell; and reading one of the charge storing cells to determine the program state of each of the charge storing cells as an indication of the data value stored by the memory device.

14. The method according to claim 13, wherein the program state for the first charge storing cell and the second charge storing cell corresponds to one of the first, second or third charged program levels, and storing the first amount of charge includes programming the first charge storing cell by injecting electrons into the first charge storing cell and storing the second amount of charge includes programming the second charge storing cell by injecting electrons into the second charge storing cell.

15. The method according to claim 14, wherein the read one of the charge storing cells is the second programmed charge storing cell.

16. The method according to claim 13, wherein the read one of the charge storing cells is the second programmed charge storing cell.

17. The method according to claim 13, wherein the charge storing cells are regions of a charge storing layer that is operatively arranged with a first conductive region adjacent the first charge storing cell, a second conductive region adjacent the second charge storing cell and a gate electrode and storing the charge program level for each charge storing cell respectively includes applying a source bias voltage potential to the conductive region adjacent the programmed charge storing cell.

18. The method according to claim 13, wherein the charge storing cells are regions of a charge storing layer that is operatively arranged with a first conductive region adjacent the first charge storing cell, a second conductive region adjacent the second charge storing cell and a gate electrode and during reading, a voltage potential is applied to the conductive region adjacent the unread one of the charge storing cells, the voltage potential being less than one volt.

19. The method according to claim 18, wherein the voltage potential applied to the conductive region adjacent the unread one of the charge storing cells is about 0.4 volts to about 0.7 volts.

20. The method according to claim 18, wherein the read one of the charge storing cells is the second of the charge storing cells to be programmed.

21. The method according to claim 18, wherein the read one of the charge storing cells is the first of the charge storing cells to be programmed.

22. The method according to claim 18, wherein during reading, a voltage potential is applied to the gate electrode and the conductive region adjacent the read charge storing cell is grounded.

23. The method according to claim 13, wherein each program level establishes a different threshold voltage for the memory device.

24. The method according to claim 13, wherein reading the charge storing cell includes comparing a threshold voltage of the memory device against a set of values to determine the program state of the read one of the charge storing cells.

25. The method according to claim 13, further comprising outputting a digital value associated with the data value stored by the memory device, the digital value being at least two bits in length.

26. The method according to claim 13, wherein the charged program levels are obtained by varying a program voltage applied to at least one of a gate electrode, a first conductive region and a second conductive region of the memory device.

* * * * *

UNITED STATES PATENT AND TRADEMARK OFFICE
CERTIFICATE OF CORRECTION

PATENT NO. : 6,768,673 B1
DATED : July 27, 2004
INVENTOR(S) : Hsia et al.

It is certified that error appears in the above-identified patent and that said Letters Patent is hereby corrected as shown below:

Column 9,
Line 35, replace "$I_{vref}/B$" with -- $I_{vrefB}$ --.
Line 36, replace "$I_{vref}/C$" with -- $I_{vrefC}$ --.
Line 37, replace "$I_{vref}/D$" with -- $I_{vrefD}$ --.

Column 11,
Line 37, replace "40 the" with -- 40 of the --.

Signed and Sealed this

Sixteenth Day of November, 2004

JON W. DUDAS
*Director of the United States Patent and Trademark Office*